March 21, 1967 H. FORSTHUBER ET AL 3,310,752
CIRCUIT ARRANGEMENT FOR EFFECTING THE FORWARD AND REVERSE CONTROL OF A TWO-STAGE TRANSISTOR AMPLIFIER
Filed Dec. 29, 1964
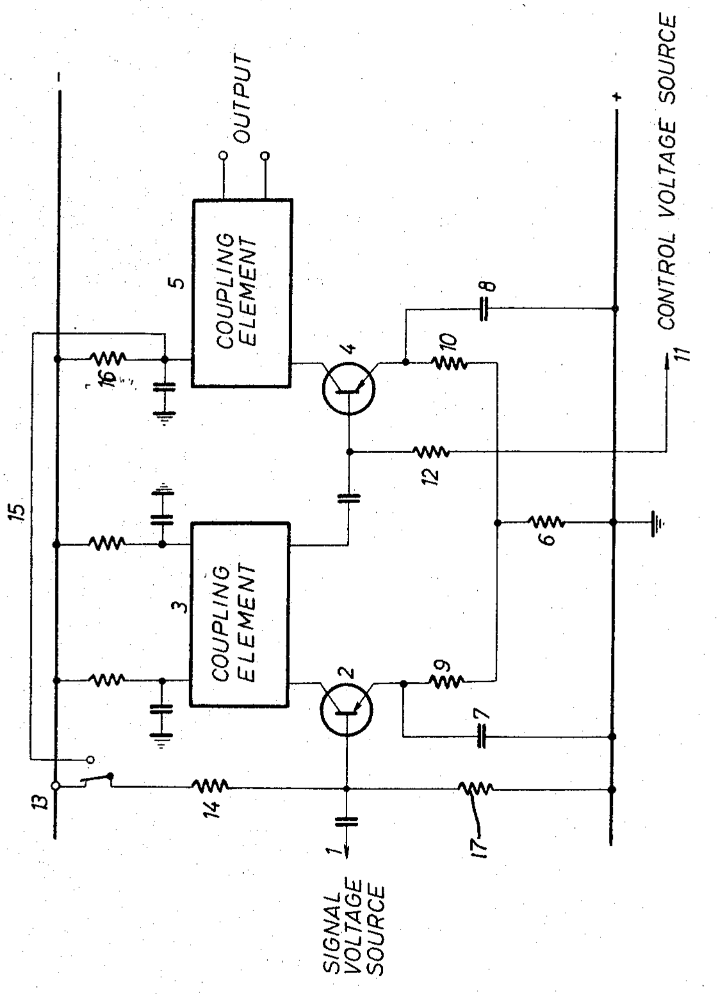
INVENTORS
HUBERT FORSTHUBER
GERHARD MICHAELIS
BY Percy P. Lantzy
ATTORNEY 3,310,752

CIRCUIT ARRANGEMENT FOR EFFECTING THE FORWARD AND REVERSE CONTROL OF A TWO-STAGE TRANSISTOR AMPLIFIER

Hubert Forsthuber, Durrn, and Gerhard Michaelis, Rastatt, Germany, assignors to International Standard Electric Corporation, New York, N.Y., a corporation of Delaware Filed Dec. 29, 1964, Ser. No. 421,856
Claims priority, application Germany, Jan. 4, 1964, St 21,523
3 Claims. (Cl. 330—26)

The present invention relates to a circuit arrangement for effecting the forward and reverse control of a two-stage transistor amplifier, in which the control voltage is fed to the base electrode of the second transistor.

In an already known circuit of this type the stage either preceding or following a reverse-controlled stage, receives an amplified control voltage taken from the collector circuit of the reverse-controlled transistor. By the direct coupling of the collector circuit of this transistor to the base circuits of other transistors of the amplifier, the circuit arrangement is strongly dependent upon variations of the operating voltage. Moreover, also the control voltage requirement from the receiving rectifier is still relatively high, because the emitter electrodes of the controlled transistors do not receive a fixed, but a variable biasing potential counteracting the control operation.

Moreover, the signal handling capability is insufficient with respect to many cases of practical application.

For improving the control effect, therefore, it is known to apply the emitter electrodes of an amplifier to a fixed voltage which is derived e.g., from a stabilizing cell.

Further, there is already known a two-stage transistor arrangement designed as a compensating circuit, in which the base electrode of the first transistor is applied to the signal voltage, and in which the base electrode of the second transistor is applied to the control voltage. Via a common resistor, the emitter electrodes are connected to ground, and the collector electrodes are joined to one another through a variable resistor with the aid of which the compensation may be adjusted. This arrangement, of course, is suitable for achieving an optimum control effect in special cases, but the maximum output amplitude is about 50 db smaller than the input signal. This is one reason why such a type of control circuit is unsuitable for many purposes.

There are also known other two-transistor types of compensating circuits which are suitable for effecting the automatic gain control, and in which the emitter electrodes are commonly applied to a capacitively bridged resistor. All of these compensating circuits, however, have the disadvantage of requiring two transistors for each amplifier stage. In addition thereto the applicability of such circuits remains substantially restricted to low-frequency amplifiers, because the variable phase change in the course of the low-frequency amplification does not permit any unobjectionable compensation, and may even lead to the self-excitation of the stage.

Finally, there is also known a cascade amplifier circuit with a multi-frequency shift, in which three transistors have a common, partly capacitively bridged emitter resistance forming part of the associated oscillator circuit. This circuit, however, does not provide the possibility of effecting an AGC.

The present invention is based on the problem of providing a transistor amplifier for the gain control of which there is only required a small control voltage, and which avoids the disadvantages of the hitherto conventional types of circuit arrangements.

According to the invention this is accomplished in that the two transistors, in a manner known per se, have a common, capacitively bridged emitter resistance, and in that the no signal base currents of the transistors are adjusted to relatively high values, so that the control effect of the first, forward gain-controlled transistor has almost reached the maximum value by the time the control effect of the second reverse gain-controlled transistor is initiated.

This difference between the two kinds of control are that a "reverse control" is involved whenever the amplification as effected by the transistor, is diminished by a control voltage, causing a dimunition of the base and, consequently, of the collector current. A "forward control" is involved whenever the amplification, as effected by the transistor, is reduced by a control voltage causing an increase of the base and consequently, of the collector current. In this case there is utilized the property which is particularly distinguished in some types of transistors, that the mutual conductance which is decisive for the step-by-step amplification may be reduced beyond a predetermined limit by reducing as well as by increasing the base current.

This circuit arrangement has a very small voltage intake, requires no additional circuit elements for stabilizing the emitter voltages, is extensively independent of the operating voltage, and has almost the same signal-handling capability as a tube-type stage. The input impedance almost remains constant, whereas the output impedance increases as the control voltage increases. It is known that in the hitherto conventional reverse AGC there does not only appear a variation in the mutual conductance of the transistor, but also a mismatch of the subsequently arranged coupling circuit (e.g. IF bandpass filter), assisting the control affect. Likewise, with this arrangement the mismatch of the coupling element between the control transistors, assist the control affect and have no detrimental effect to the contrary.

Both the mode of operation and the construction of the inventive type of circuit arrangement will now be explained in detail with reference to the accompanying circuit diagram.

In the case of transistor amplifiers the controllability during the reverse control only starts at relatively low base currents, and only at relatively high base currents in the case of the forward control. Within the range of base currents lying between there are only changed the emitter and collector currents, without the gain of the respective stage being noteworthily affected thereby. This fact is utilized by the inventive type of control circuit.

The signal voltage is applied via the capacitor 1, to the base electrode of transistor 2, and from the collector electrode thereof, via the coupling element 3, to the base electrode of the subsequently following transistor 4, to the collector electrode of which the coupling element 5 is connected. The coupling elements may contain transformers, repeaters, oscillating circuits, or RC-combinations. The emitter electrodes of transistors 2 and 4 have a common emitter resistance 6, and, with respect to the signal frequency, are applied to ground by the action of capacitors 7 and 8. By suitably selecting the resistances 6, 17, 14, and the initial voltage of the line 11, the base currents of both transistors are adjusted to relatively high values. The resistors 9 and 10 serve to affect the individual setting or correction respectively, of the operating points, and act as an overload protection for the transistors. Via the lead 11 and across the resistor 12, the control voltage is applied to the base of the second transistor 4, and effects a reverse control thereof. The control voltage, as applied to line 11, will in most cases be a detected AGC signal from a later stage. However, it is possible to derive the control voltage from a potentiometer connected to a suitable source of voltage, and serving as a manual control.

The emitter current of the transistor 4 decreases as the control voltage increases, so that the voltage will drop at the common emitter resistor 6. This voltage variation at the resistor 6 simultaneously effects a variation of the base-emitter voltage of transistor 2 and, consequently, a forward control of the latter. On account of this there is effected an increase (rise) of the emitter current of transistor 2 causing an increase of the voltage drop across resistor 6. Therefore, since the voltage across resistor 6 is only varied by the amount necessary for controlling the transistor 2, additional circuit elements for stabilizing the emitter voltages of transistors 2 and 4 may be omitted. At the same time the common emitter resistor 6 effects a stabilization of the circuit with respect to operating-voltage variations.

The normal operating point of transistor 4 is so adjusted that the reverse control is initiated late, and the normal operating point of transistor 2 is set in such a way that, under consideration of the desired delay in the starting of the control, the forward control is initiated at an early stage, i.e., both transistors have relatively high no signal currents. By this measure there is achieved above all the high signal handling capability which almost equals that of a controlled tube-type stage.

Due to the fact that transistor 4 acts as an amplifier for the control voltage of transistor 2, and that the emitter voltages, by the action of the common resistor 6, almost remain constant, and that the mismatch of the coupling element 3, appearing during the control operation, serves to assist the control effect, only a small control voltage of e.g. 1.5 volts is necessary for achieving a gain variation of 80 db.

In further embodying the idea of the invention the control voltage requirement may be additionally reduced in that the base electrode of the first, forward-controlled transistor receives an additional, amplified control voltage derived from the collector circuit of the second, reverse-controlled transistor. To this end it will be necessary to remove the connection 13, and to connect resistor 14 to resistor 16 via the lead 15.

While we have described above the principles of our invention in connection with specific apparatus, it is to be clearly understood that this description is made only by way of example and not as a limitation to the scope of our invention as set forth in the objects thereof and in the accompanying claims.

What is claimed is:

1. A circuit arrangement for affecting the forward and reverse control of a two-stage transistor amplifier comprising:

a source of D.C. potential;

a first forward controlled transistor having a base, emitter, and collector;

a second reverse controlled transistor having a base, emitter, and collector;

means connecting said first and second transistor collectors to said source of D.C. potential;

means coupling the collector of said first transistor to the base of said second transistor;

a first emitter resistor connected between said first transistor emitter and a junction point;

a second emitter resistor connected between said second transistor emitter and said junction point;

a common emitter resistor connected between said junction point and ground;

a source of control voltage resistively coupled to the base of said second transistor;

a source of signal voltage capacitively coupled to the base of said first transistor; and additional resistance means coupled to the base of said first transistor which in cooperation with said common emitter resistor adjusts the no signal base current of said first and second transistors to relatively high values, whereby the operating point of said first transistor is set so that the control affect has almost reached its maximum value by the time the control operation is initiated by said second reverse controlled transistor due to application of said control voltage to the base of said second transistor.

2. A circuit arrangement according to claim 1 further including:

a first signal frequency capacitor coupling said first transistor emitter to ground;

a second signal frequency capacitor coupling said second transistor emitter to ground; and an output coupling element connected to the collector of said second transistor for coupling the output of said second transistor to a succeeding stage.

3. A circuit arrangement according to claim 2 wherein means are provided for selectively coupling the collector electrode of said second transistor the base electrode of said first transistor, such that the base electrode of said first forward controlled transistor receives an additional amplified control voltage as derived from the collector of said second reverse controlled transistor.

References Cited by the Examiner

UNITED STATES PATENTS

| | | | |
|---|---|---|---|
| 2,912,572 | 11/1959 | Wilhelmsen | 325—411 |
| 3,036,275 | 5/1962 | Harmer | 330—29 |
| 3,123,777 | 3/1964 | Thomas | 330—29 |

ROY LAKE, *Primary Examiner.*

R. P. KANANEN, J. B. MULLINS, *Assistant Examiners.*